(12) United States Patent
Hshieh et al.

(10) Patent No.: US 6,376,315 B1
(45) Date of Patent: Apr. 23, 2002

(54) METHOD OF FORMING A TRENCH DMOS HAVING REDUCED THRESHOLD VOLTAGE

(75) Inventors: Fwu-Iuan Hshieh, Saratoga; Koon Chong So, Fremont, both of CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/540,856

(22) Filed: Mar. 31, 2000

(51) Int. Cl.$^7$ .............................. H01L 21/336
(52) U.S. Cl. ................ 438/270; 438/271; 438/272; 257/330
(58) Field of Search .................. 438/270, 271, 438/272; 257/330

(56) References Cited

U.S. PATENT DOCUMENTS

| | | | | |
|---|---|---|---|---|
| 5,072,266 A | * | 12/1991 | Bulucea et al. | 357/23.4 |
| 5,468,982 A | * | 11/1995 | Hshieh et al. | 438/270 |
| 5,597,765 A | * | 1/1997 | Yilmaz et al. | 438/270 |
| 5,907,776 A | | 5/1999 | Hshieh et al. | 438/270 |
| 5,970,344 A | * | 10/1999 | Kubo et al. | 438/270 |
| 5,981,344 A | * | 11/1999 | Hshieh et al. | 438/270 |
| 6,211,018 B1 | * | 4/2000 | Nam et al. | 438/270 |
| 6,096,608 A | * | 8/2000 | Williams | 438/270 |
| 6,218,217 B1 | * | 4/2001 | Uenishi et al. | 438/270 |
| 2001/0008291 A1 | * | 7/2001 | Aoki et al. | 257/330 |
| 2001/0008788 A1 | * | 7/2001 | Hshieh et al. | 438/270 |

OTHER PUBLICATIONS

Semiconductor Technology Handbook, Technology Associates, pp. 4.4, 4.15–4.16, Jan. 15, 1985.

* cited by examiner

*Primary Examiner*—Charles Bowers
*Assistant Examiner*—David S Blum
(74) *Attorney, Agent, or Firm*—Mayer Fortkort & Williams, PC; David B. Bonham, Esq.; Karin L. Williams, Esq.

(57) ABSTRACT

A method of manufacturing one or more trench DMOS transistors is provided. In this method, one or more or more body regions adjacent one or more trenches are provided. The one or more trenches are lined with a first insulating layer. A portion of the first insulating layer is removed along at least the upper sidewalls of the trenches, exposing portions of the body regions. An oxide layer is then formed over at least the exposed portions of the body regions, resulting in regions of reduced majority carrier concentration within the body regions adjacent the oxide layer. This modification of the majority carrier concentration in the body regions is advantageous in that a low threshold voltage can be established within the DMOS transistor without resorting to a thinner gate oxide (which would reduce yield and switching speed) and without substantially increasing the likelihood of punch-through.

24 Claims, 7 Drawing Sheets

METHOD OF FORMING A TRENCH DMOS HAVING REDUCED THRESHOLD VOLTAGE

FIELD OF THE INVENTION

The present invention relates generally to microelectronic circuits, and more particularly to a process for forming trench DMOS devices.

BACKGROUND OF THE INVENTION

Metal oxide semiconductor field effect transistor (MOSFET) devices using trench gates provide low turn-on resistance and are often used for low power applications. In a trench MOSFET device, the channels are arranged in a vertical manner, instead of horizontally as in most planar configurations. FIG. 1 shows a cross-sectional view of a conventional trenched gate MOSFET device having a unit cell designated by reference numeral 2. The MOSFET cell 2 includes a trench 4 filled with conductive material 6 separated from the silicon regions 8 by a thin layer of insulating material 10. A body region 12 is diffused in an epitaxial layer 18, and a source region 14 is in turn diffused in the body region 12. Due to the use of these two diffusion steps, a transistor of this type is frequently referred to as a double-diffused metal oxide semiconductor field effect transistor with trench gating or, in brief, a "trench DMOS".

As arranged, the conductive and insulating materials 6 and 10 in the trench 4 form the gate 15 and gate oxide layer 16, respectively, of the trench DMOS. In addition, the depth L measured from the source 14 to the epitaxial layer 18 constitutes the channel length L of the trench DMOS cell 2. The epitaxial layer 18 is a part of the drain 20 of the trench DMOS cell 2.

When a potential difference is applied across the body 12 and the gate 15, charges are capacitively induced within the body region 12 adjacent to the gate oxide layer 16, resulting in the formation of the channel 21 of the trench DMOS cell 2. When another potential difference is applied across the source 14 and the drain 20, a current flows from the source 14 to the drain 20 through the channel 21, and the trench DMOS 2 is said to be in the power-on state.

The conventional trench DMOS device described above has an inherently high threshold voltage. Referring to FIG. 1, the threshold voltage is defined as the minimal potential difference between the gate 15 and the body 12 that is required to create the channel 21 in the body region 12. The threshold voltage is dependent upon a variety of factors, including the thickness of the gate oxide 16 and the impurity concentration of the body region 12.

Frequently, the thickness of the gate oxide 16 is reduced to lower the threshold voltage. Unfortunately, this approach seriously undercuts the final production yield as well as the reliability of the trench DMOS. For example, as can be seen from FIG. 1, the thinner the gate oxide layer 16, the higher the probability of the conductive material 6 short-circuiting the semiconductor regions 8 through a defect in the gate oxide layer 16. Moreover, a decrease in oxide thickness increases the gate charge, reducing switching speed.

Another way to reduce the threshold voltage is to lower the impurity concentration of the body region 12. FIG. 2 shows the diffusion profile of a trench DMOS cell. The x-axis of FIG. 2 represents the distance measured from the planar surface 22 and into the source 14, body region 12 and drain region 20 of FIG. 1. For example, the source region 14 is located between x=0 to x=$x_{js}$. Similarly, the body region 12 is positioned between x=$x_{js}$ and X=$x_{jb}$. The drain region 20 begins at x=$x_{jb}$, and continues to the right-hand edge of FIG. 2. The y-axis of FIG. 2 corresponds to the impurity concentration (absolute value) of the various regions.

During normal operation, the drain region 20 and the body region 12 are reverse biased. Consequently, a depletion layer is formed, characterized by a depletion region 24 with a depletion width W as shown in FIG. 1. As is well known in the art, the lighter the impurity concentration of a region, the wider the depletion width W extending into that region. Referring back to FIG. 1, if the body region 12 is too lightly doped, the depletion layer 24 may reach the source region 14 during operation, resulting in an undesirable effect called "punch-through". During punch-through, current flows directly from the source 14 to the drain 20 without passing through the channel 21, and breakdown ensues.

Referring again to FIG. 2, the hatched area underneath the impurity curve 30 from x=$x_{js}$ to x=$x_{jb}$ corresponds to the total charge stored in the body region 12. The threshold voltage of the trench DMOS cell 2 can be lowered by reducing the impurity concentration of the body region 12, as is graphically shown by the lowered curve 26 (shown with a dashed line in FIG. 2). The lowering of the impurity concentration in the body region 12, however, results in a widening of the depletion layer 24 and increases the possibility punch-through in the trench DMOS 2 as described above.

There have also been attempts to diffuse the source region 14 to a deeper depth, as shown in FIG. 2 by another dashed line curve 28, intersecting with the body impurity diffusion curve 30 to form a new source junction. As with reducing impurity concentration in the body region 12, the purpose is to reduce the total charge stored in the body region 12 and thus reduce threshold voltage. However, punch-through is made more likely in this scenario, because the distance traveled by the depletion layer 24 before reaching the source region 14 is reduced.

Yet another approach is presented in U.S. Pat. No. 5,907,776. In this patent, the conventional dopant profile for the body region, illustrated by dashed line 30 in FIG. 3, is altered. The y-axis in FIG. 3, which is analogous to that of FIG. 2, corresponds to the absolute impurity concentration of the various regions of the semiconductor structure 2. In FIG. 3, the impurity concentrations of the source region 14, the body region 12 and the drain region 20 are represented by the curves 64, 66 and 68, respectively. Again, the source region 14 is located between the planar surface (x=0) and x=$x_{js}$, the body region 12 is positioned between x=$x_{js}$ and x=$x_{jb}$, and the drain region 20 begins at x=$x_{jb}$. It should be noted that in FIG. 3, the excess impurity concentration for the body impurity curve 66 adjacent source boundary x=$x_{js}$ is truncated relative to the conventional body impurity curve 30, which is shown in dashed lines. The leveling of the impurity profile for curve 66 adjacent to the source/body boundary x=$x_{js}$ serves several functions. First, the threshold voltage is substantially reduced due to the reduced impurity concentration (and hence reduced total charge) in the body region 12. Moreover, the reduction in charge is remote from the body/drain boundary x=$x_{jb}$, where the depletion region 24 originates and extends. As a result, there is practically no compromise in the impurity concentration in the bulk of the body region 12 as far as the depletion layer is concerned, and the reduction in impurity concentration has little effect on punch-through.

U.S. Pat. No. 5,907,776 teaches that the truncated body diffusion curve 66 of FIG. 3 is created by body region compensation, preferably involving successive implantation steps. See, e.g., col. 5, line 48 to col. 6, line 13 and col. 7, lines 39–56. A P-type material such as boron is preferred, because it requires less implant energy than other N-type counterparts. Compensation with a P-type impurity means that that body region must be N-type and hence the transistor must be of the P-N-P variety. An N-P-N structure (i.e., an N-channel device), however, is frequently more desirable than a P-N-P structure (i.e., a P-channel device), because such structures have better current capability due to higher electron mobility. Compensation of a P-type body region with an N-type dopant, however, requires one or more high-energy implantation steps. For example, referring to FIG. 6 of U.S. Pat. No. 5,907,776, a penetration distance of 0.3 microns (which is exemplified in this patent) requires an implant energy of 83 eV when P-type boron is used as the implantation species. For the same penetration depth, N-type dopants phosphorous and arsenic require implantation energies of 200 eV or more. Unfortunately, such energies are beyond the limitations of many fabrication foundries.

SUMMARY OF THE INVENTION

The above and other deficiencies in the prior art are overcome by the process of the present invention.

According to an embodiment of the invention, a method for manufacturing one or more trench DMOS transistors is provided. In this embodiment, a substrate of a first conductivity type is supplied, and an epitaxial layer of the first conductivity type, preferably having a lower majority carrier concentration than the substrate, is formed over the substrate. The substrate and epitaxial layer are preferably of N-type conductivity and are preferably formed of silicon.

A region of a second conductivity type is then formed within an upper portion of the epitaxial layer, and a plurality of trenches are formed within the epitaxial layer to define one or more body regions within the region of second conductivity type. Preferably, the step of forming the region of second conductivity type includes implanting and diffusing a dopant into the epitaxial layer, and the step of forming the trenches comprises forming a patterned masking layer over the epitaxial layer and etching the trenches through the masking layer. The second conductivity type is preferably P-type conductivity, more preferably, provided by a boron dopant.

A first insulating layer that lines the trenches is subsequently formed, and a conductive region is provided within the trenches adjacent to the first insulating layer lining the trenches. The first insulating layer is preferably an oxide layer and is preferably formed by dry oxidation. The conductive region is preferably a polycrystalline silicon region, and it is preferably formed by depositing a layer of polycrystalline silicon and subsequently etching the polycrystalline silicon layer.

The majority carrier concentration within the one or more body regions is modified by removing a portion of the first insulating layer along at least upper sidewalls of the trenches, preferably by wet etch, such that portions of the body regions are exposed along the upper sidewalls. An oxide layer is then formed over at least the exposed portions of the body regions, resulting in regions of reduced majority carrier concentration within the body regions adjacent the oxide layer. This oxide-forming step can be, for example, dry oxidation at a temperature ranging from 900 to 1100° C., more preferably 900 to 950° C. Alternatively, the oxide layer can be formed in steam at a temperature ranging from 900 to 1100° C., more preferably 900 to 950° C.

A plurality of source regions of the first conductivity type are formed within upper portions of the body regions adjacent the trenches such that the source regions are adjacent the regions of reduced majority carrier concentration within the body regions. The source regions are preferably formed by providing a patterned masking layer and implanting and diffusing a dopant into the body regions.

One advantage of the present invention is that a low threshold voltage can be established without resorting to a thinner gate oxide (which would reduce yield and switching speed) and without substantially increasing the likelihood of punch-through.

Another related advantage is that oxide thickness, and hence switching speed and yield, can be maximized, while maintaining an adequately low threshold voltage.

Yet another advantage is that a desirable impurity profile can be obtained in the body region, without having to resort to high implantation energies or a P-N-P structure.

These and other embodiments and advantages will become immediately apparent to those of ordinary skill in the art upon review of the Detailed Description and claims to follow.

DETAILED DESCRIPTION OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 4A:
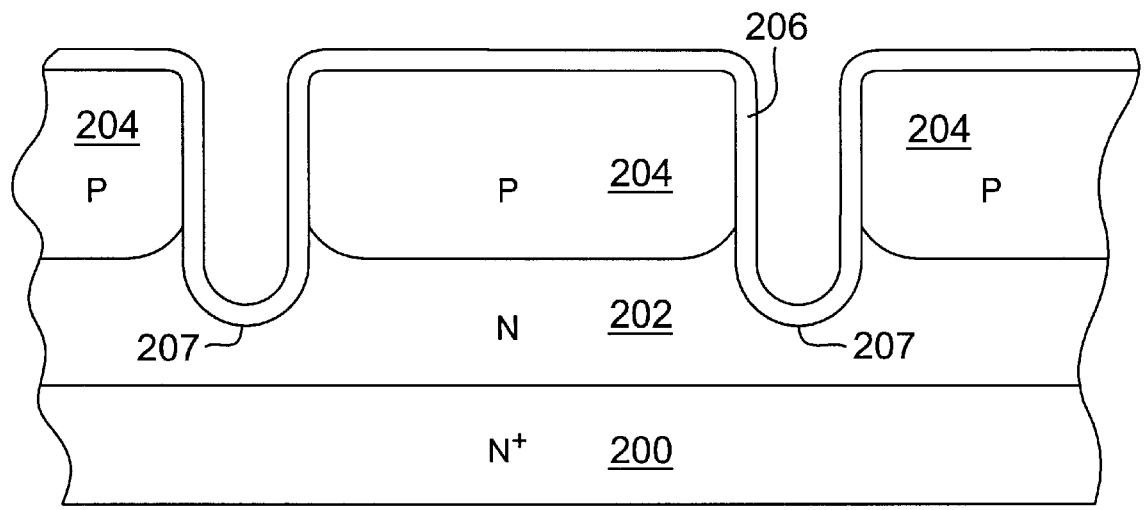
FIGS. 4A–4F are sectional views illustrating a method of manufacturing a trench DMOS according to an embodiment of the invention.

Referring now to FIG. 4A, an N-doped epitaxial layer 202 is grown on an N+doped substrate 200. For example, epitaxial layer 202 can be 5.5 microns thick and have a doping concentration of $3.4 \times 10^{16}$ cm$^{-3}$ for a 30 V trench DMOS device. Next, P-body regions 204 are formed in the epitaxial layer 202 by implantation, diffusion and trench-forming processes. For example the epitaxial layer 202 may be implanted with boron at 50 keV with a dosage of $6 \times 10^{13}$ cm$^{-3}$, followed by diffusion at 1100° C. A patterned masking layer (not shown) is then provided and trenches 207 are formed through apertures in the patterned masking layer. Trenches 207 are preferably dry etched through the apertures in the masking layer via reactive ion etching, for example, to a depth that ranges from 1.0 to 2.0 microns, forming discrete P-body regions 204. The patterned masking layer is then removed and an oxide layer 206 is formed over the surface of the entire structure, typically by dry oxidation. Oxide thickness in the range of 300 to 700 Angstroms is typical for layer 206. The resulting structure is shown in FIG. 4A.

Figure 4B:
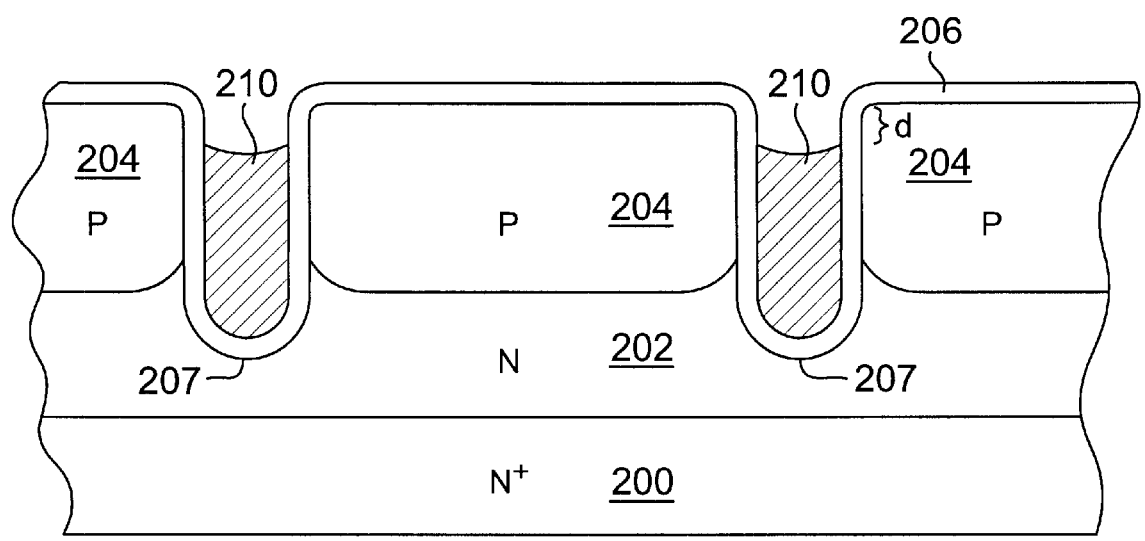

The surface of the structure is then covered (and the trenches are filled) with a polysilicon (i.e., polycrystalline silicon) layer using techniques known in the art, such as CVD. The polysilicon is doped, for example, N-type to reduce its resistivity, typically on order of 20 Ω/sq. N-type doping can be carried out, for example, during CVD with phosphorous chloride or by implantation with arsenic or phosphorous. The polysilicon layer is then etched, for example, by reactive ion etching, to optimize its thickness within the trenches and to expose portions of oxide layer 206 as shown in FIG. 4B. Due to etching uniformity concerns, the polysilicon layer is slightly over-etched, and the thus-formed polysilicon gate regions 210 typically have top surfaces that are 0.1 to 0.2 microns below the adjacent top surfaces of the P-body region 204 (shown as distance "d" in FIG. 4B).

Commonly, at this point in the formation of the trench DMOS, the oxide layer 206 is wet etched to a targeted thickness to form an implant oxide. The implant oxide avoids implant-channeling effects, implant damage and heavy metal contamination during subsequent formation of source regions (see below).

Figure 4C:
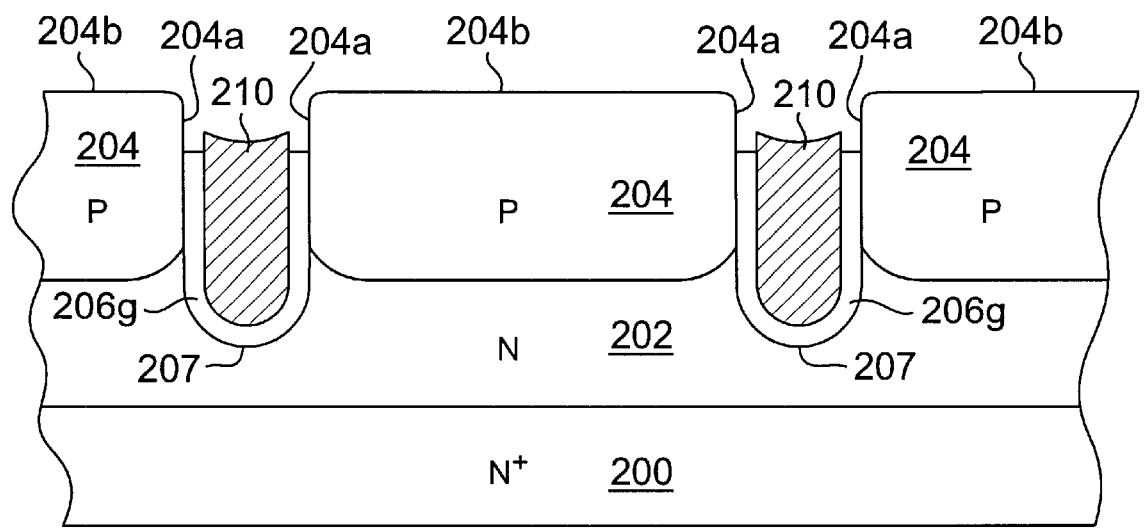

In contrast, and according to an embodiment of the present invention, the oxide layer 206 is subjected to a more vigorous etch, for example, by increasing the time of the wet etch. This etches the oxide layer 206 to a point below the upper surface of polysilicon gate regions 210, forming discrete gate oxide regions 206g as shown in FIG. 4C. As a result of this step, a portion of the oxide layer 206 is removed along upper sidewalls of the trenches, exposing upper sidewall portions 204a, as well as upper surface portions 204b, of the P-body regions 204.

Figure 4D:
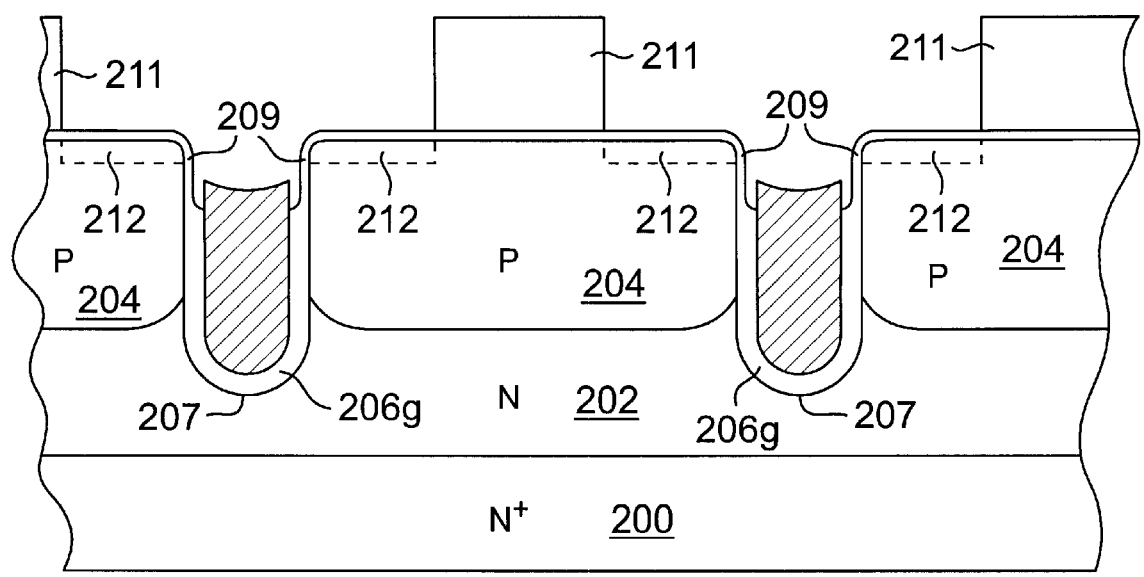

Next, as seen in FIG. 4D, a pad oxide layer 209 is grown over the exposed surfaces 204a, 204b of the P-body regions 204 shown in FIG. 4C. This step performs several functions. For instance, as in the conventional process, the pad oxide layer acts as an implant oxide, avoiding implant-channeling effects, implant damage and heavy metal contamination during subsequent formation of the source regions.

Moreover, the step of forming the pad oxide layer 209 causes a redistribution of dopant, in this case boron, between the P-body region 204 and the as-formed pad oxide layer 209.

The extent of the boron redistribution is influenced by the oxide formation conditions. For example, both the oxide growth temperature and the oxide growth conditions (e.g., dry oxidation or steam oxidation) will affect the boron concentration profile.

It is known that boron atoms redistribute during oxidation process steps. Without wishing to be held to theory, it is has been observed that this redistribution is due to three concurrent effects:

(1) the dopant segregation coefficient m, where $$m = \frac{C_{Si}}{C_{Ox}},$$

(2) the ratio of the diffusion coefficients of the dopant in silicon and in oxide or $$\frac{D_{dopant,Si}}{D_{dopant,Ox}}$$

and (3) ratio of the parabolic oxidation rate constant B and the root of the diffusion coefficient of the dopant in silicon or $$\frac{B}{\sqrt{D_{dopant,Si}}}.$$

Figure 5:
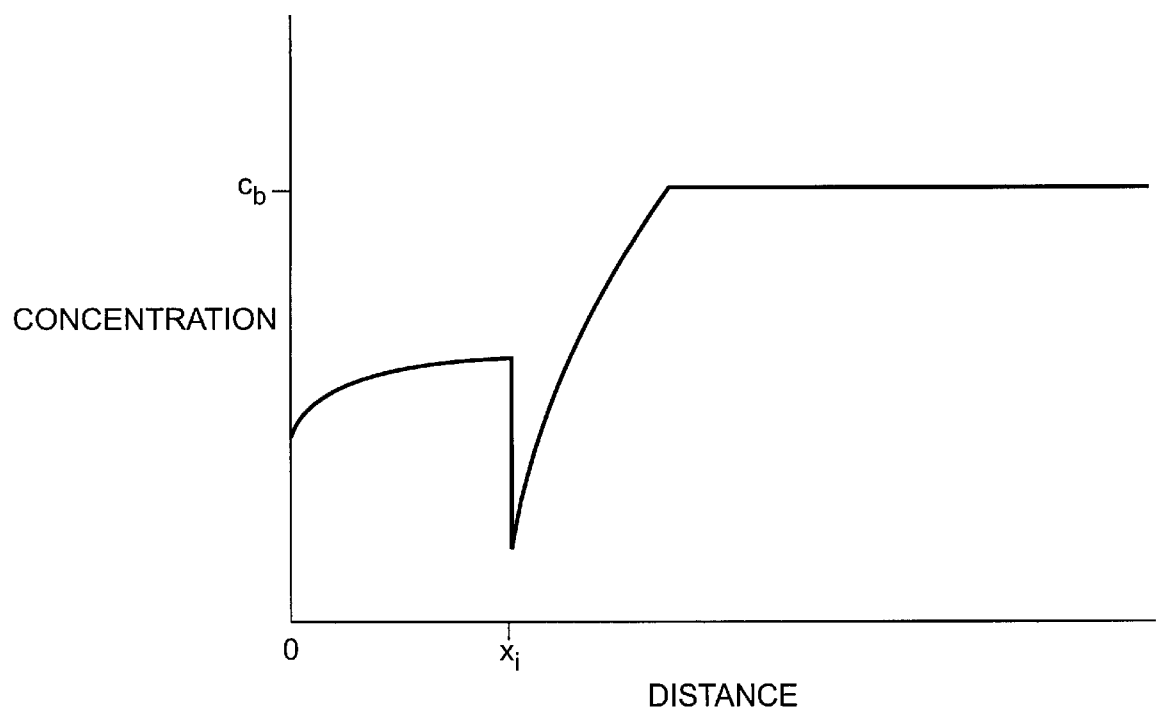
FIG. 5 illustrates approximate doping profiles in a boron-doped silicon material after formation of a surface oxide in dry oxygen at 900° C.

FIG. 5 illustrates approximate doping profiles in a boron-doped silicon material after formation of a surface oxide in dry oxygen at 900° C. In FIG. 5, the oxide region corresponds to the left-hand side of the plot between x=0 (the oxide surface) and $x_i$ (the oxide/silicon interface). The silicon region corresponds to the right-hand side of FIG. 5 in the region beyond $x_i$. Prior to oxidation, the silicon was uniformly doped at a bulk concentration $C_b$. After oxidation the bulk silicon region at the right-hand side of FIG. 5 remains at this level. However, as the interface is approached, the dopant concentration in the silicon decreases. In this case, the concentration of boron at the silicon interface is about 20% of the concentration of boron in the bulk, $C_b$. (By way of comparison, the concentration of the boron in the oxide layer at the interface is about 60% of $C_b$.)

The table to follow contains the ratio of boron concentration in silicon at the interface ($C_i$) to boron concentration in the silicon bulk ($C_b$) after oxidation of a silicon layer with initial concentration $C_b$. As noted above in connection with FIG. 5, this ratio is about 0.2 (20%) where silicon is oxidized in dry oxygen at 900° C. This ratio and several others are presented in the following table. Note from this table that a greater redistribution occurs at the interface at lower temperatures and for steam oxidation.

| Temperature (° C.) | $C_i/C_b$ after Dry Oxidation | $C_i/C_b$ after Steam Oxidation at 640 torr |
| --- | --- | --- |
| 900 | 0.2 | 0.14 |
| 1000 | 0.25 | 0.16 |
| 1100 | 0.39 | 0.20 |
| 1200 | 0.56 | 0.29 |

Additional information on this topic can be found in, e.g., *Semiconductor Technology Handbook*, pages 4.1 et seq. Technology Associates (1985), the disclosure of which is herein incorporated by reference.

As seen from the above, by forming the pad oxide layer 209 on the exposed surfaces 204a, 204b of the upper portion of the P-body region 204 (see FIG. 4C and FIG. 4D), the concentration of boron is reduced in the P-body region 204 at the interface of the oxide 209.

Subsequently, as seen from FIG. 4D, a patterned masking layer 211 is provided which defines source regions 212. Source regions 212 are typically formed within upper portions of the P-body regions 204 via an implantation and diffusion process. For example, the source regions 212 may be implanted with arsenic at 120 keV to a concentration in the range of $5 \times 10^{15}$ to $1 \times 10^{16}$ cm$^{-3}$. The resulting structure is shown in FIG. 4D. As seen from FIG. 4D, after implantation of the source regions 212, a portion of the P-body region 204 remains that is adjacent to the pad oxide layer 209 that was formed (and is hence depleted in boron concentration at the oxide interface).

Figure 4E:
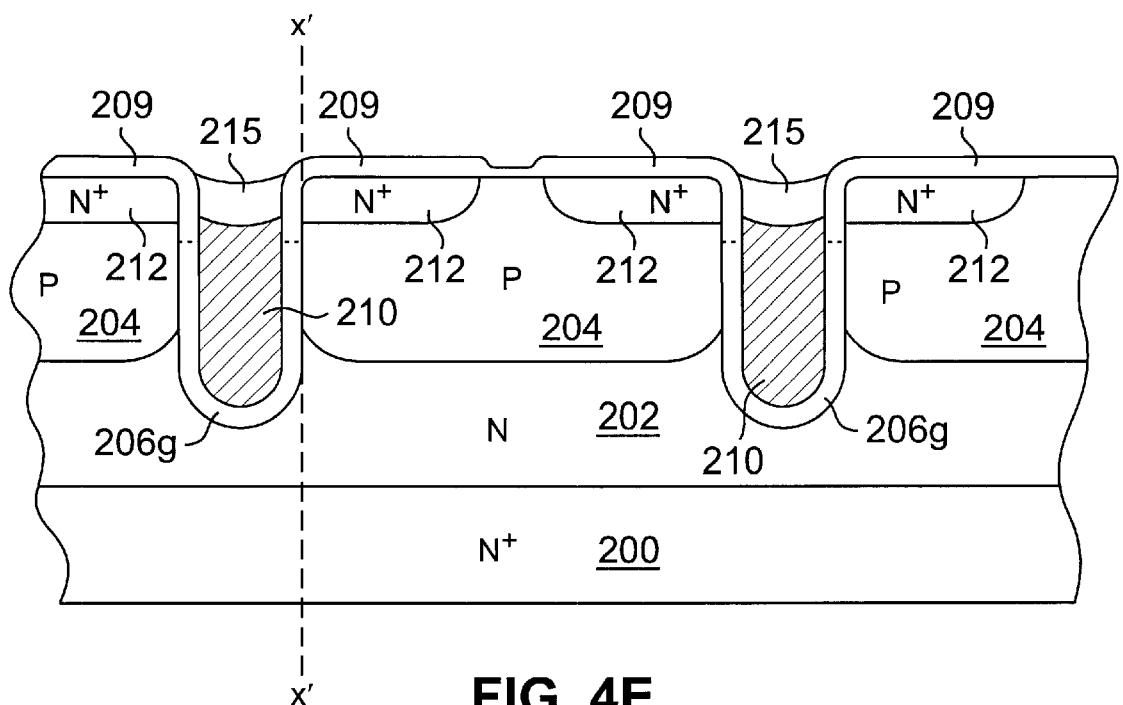

FIG. 4E shows the structure of FIG. 4D after the source dopant is diffused, for example, to a depth of approximately 0.35 microns, increasing the depth of source regions 212. This step acts to increase the thickness of the pad oxide layer 209 and forms an oxide layer 215 on the polysilicon gate regions 210. The points where the gate oxide 206g abuts the now-thickened pad oxide 209 are shown by dashed lines in FIG. 4E. Even after this diffusion step, a portion of the P-body region 204 remains that was adjacent to the pad oxide layer 209 during its formation (and thus underwent a redistribution of boron dopant during the pad oxide layer formation step). Consequently, as the oxide interface is approached in this portion of the P-body region 204, there is a decrease in boron concentration relative to the concentration that was present before pad oxide layer growth. This corresponds to a decrease in boron concentration in the channel regions immediately adjacent the source regions 212.

Figure 1:
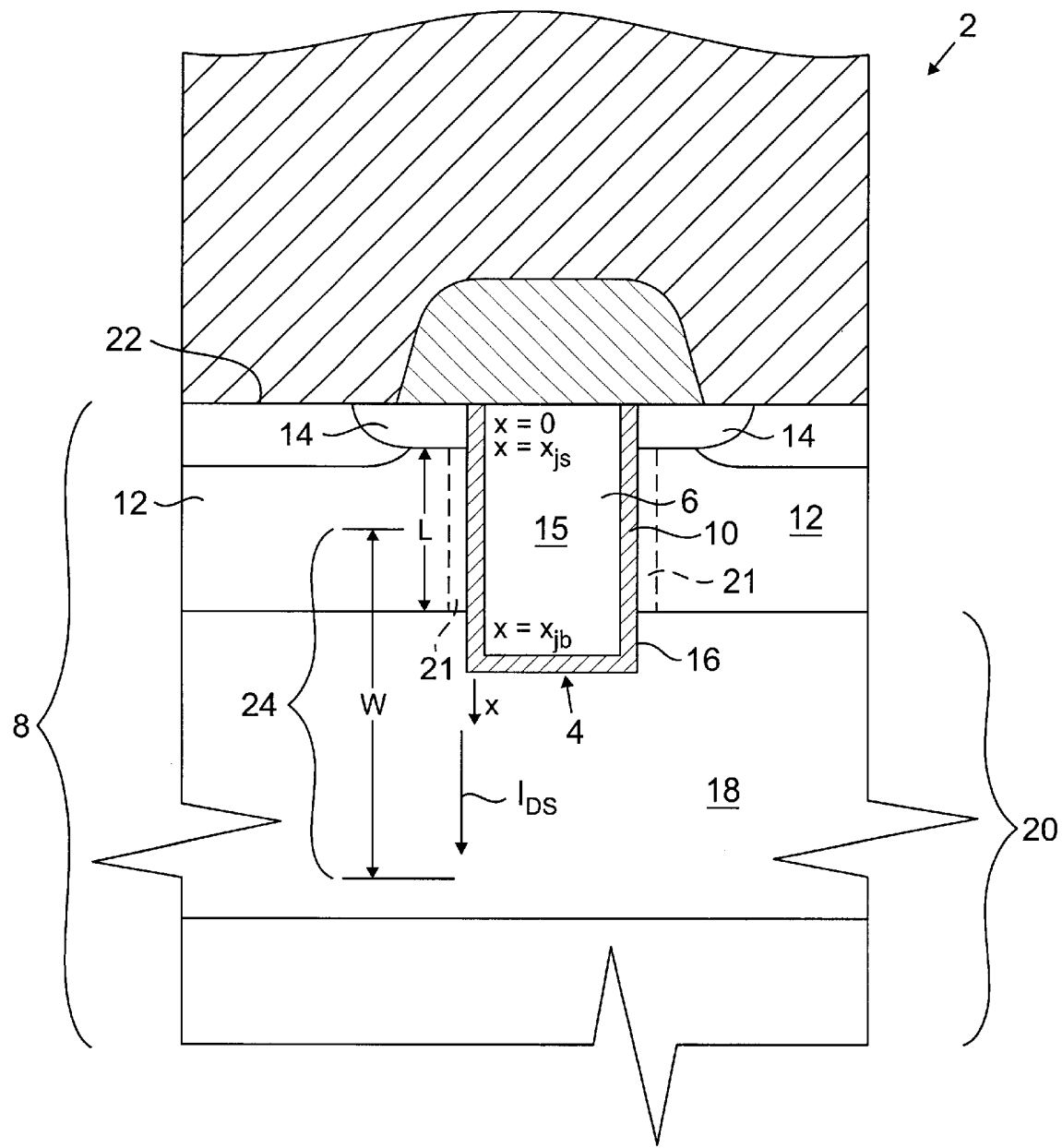
FIG. 1 is a cross-sectional view of a conventional trench DMOS device.
Figure 2:
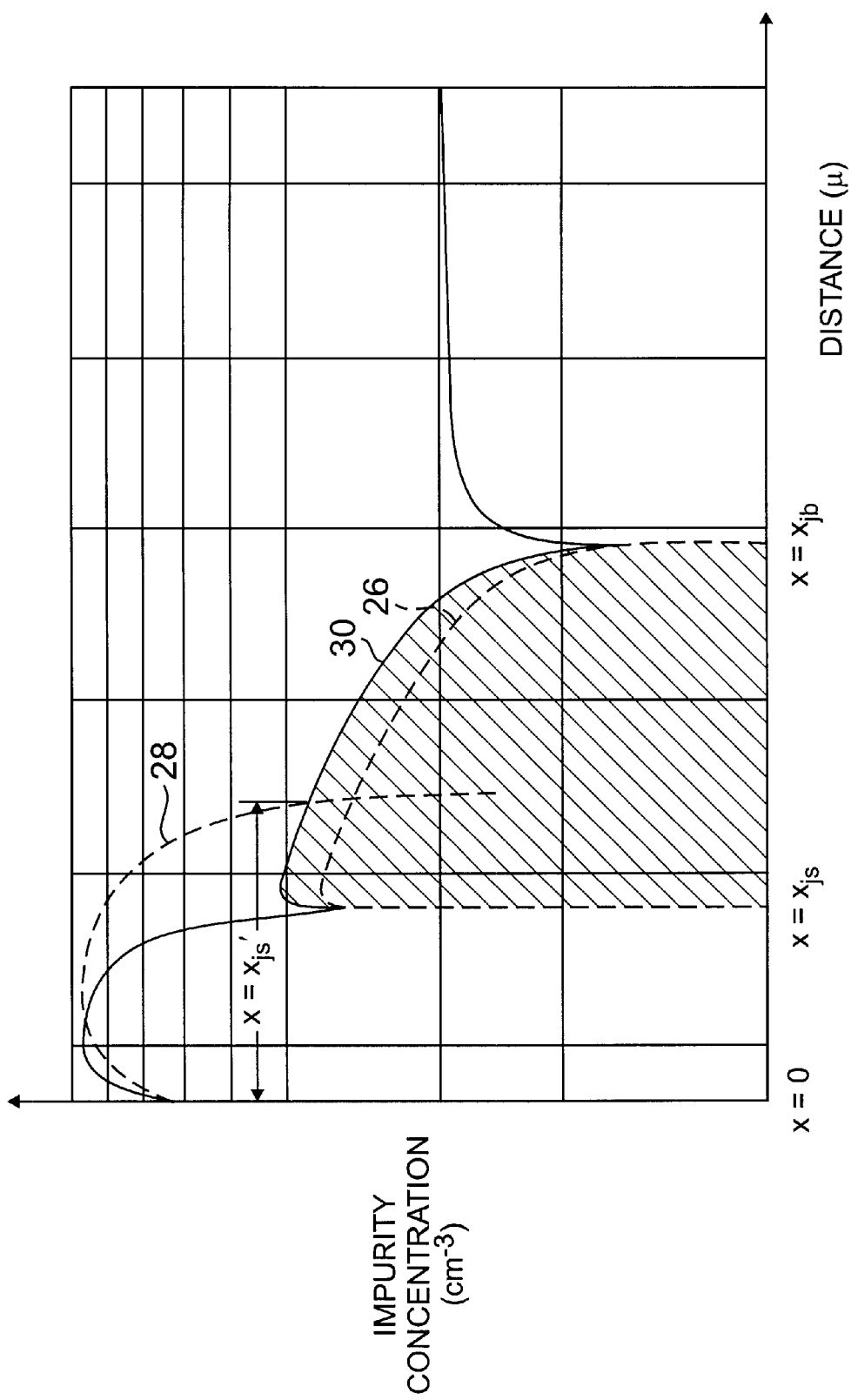
FIG. 2 is a diffusion profile for the trench DMOS device of FIG. 1 illustrating the impurity concentrations of the various regions.
Figure 3:
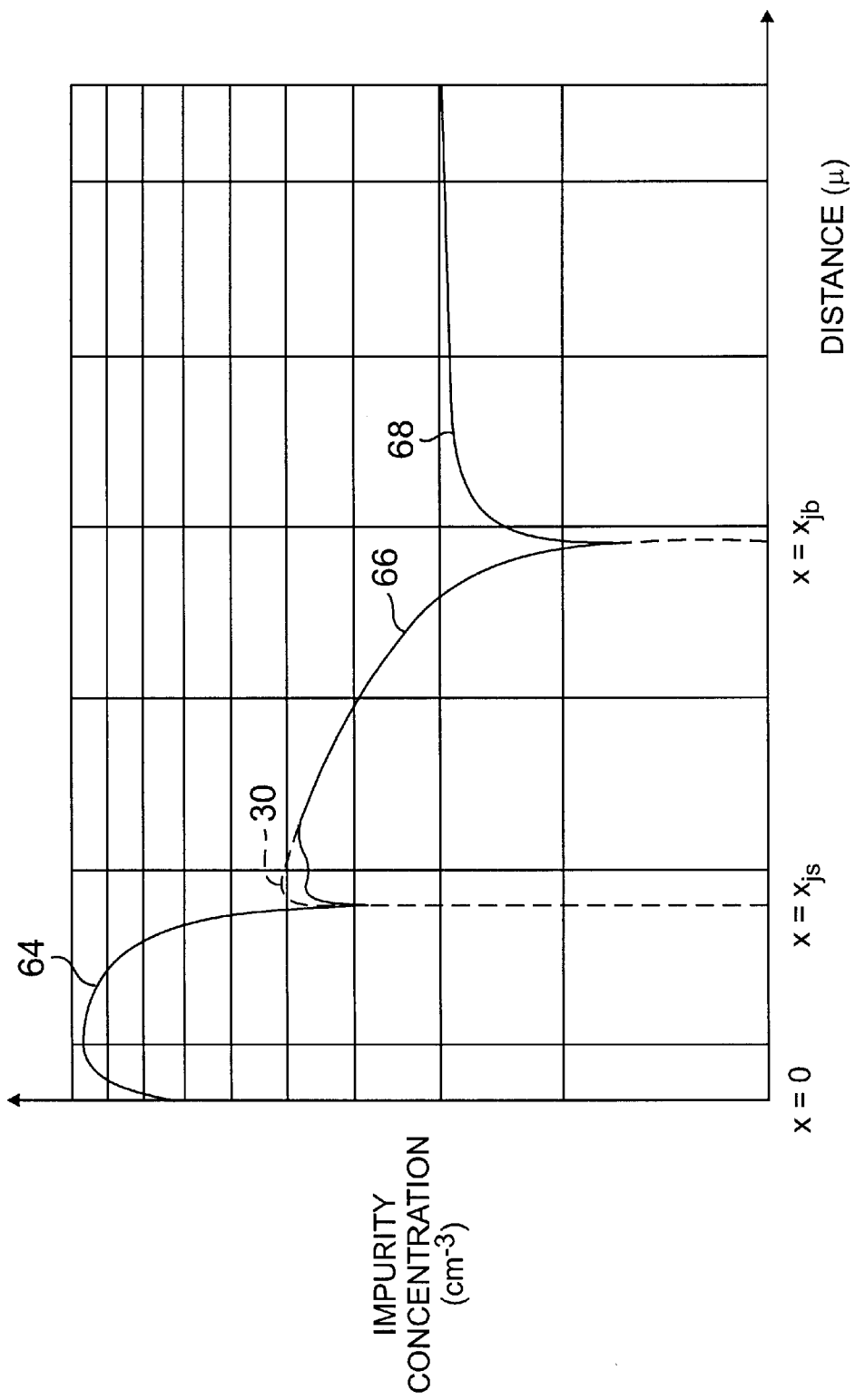
FIG. 3 is an additional diffusion profile for the trench DMOS device of FIG. 1 illustrating the impurity concentrations of the various regions.

This dopant redistribution can be seen by examining the doping concentration profile along line x'—x' in FIG. 4E, which approximates that shown in FIG. 3 without resorting to high implantation energies or a P-N-P structure. Specifically, the N+source region 212 has a doping profile like that of the region between x=0 and x=$x_{js}$ in FIG. 3; the P-body region 204 has a doping profile like that of the region between x=$x_{js}$ and x=$x_{jb}$ in FIG. 3; and the N-doped epitaxial layer 202 has a doping profile like that of the region beyond x=$x_{jb}$ in FIG. 3. Hence the doping concentration in the N+source region 212 is approximated by curve 64, the doping concentration in the P-body region 204 is approximated by curve 66, and the doping concentration in the N-doped epitaxial layer 202 is approximated by curve 68 of FIG. 3. As discussed above, by forming a pad oxide layer 209 adjacent the upper portion of the P-body region 204, the concentration of boron is reduced in the P-body region 204 at the oxide interface. This region of reduced boron concentration corresponds to the left-hand side of curve 66. Curve 30, shown as a dashed line, represents the approximate doping profile that would have existed in the absence of an etch-back step for the gate oxide 206g and in the absence of the formation of pad oxide layer 209.

Again, by the process of the present invention, a desirable doping profile like that discussed in U.S. Pat. No. 5,907,776 can be established in the P-body region, without having to resort to high implantation energies or a P-N-P structure. As previously noted, such a doping profile is beneficial in that a low threshold voltage can be established without resorting to a thinner gate oxide (which would reduce yield and switching speed) and without substantially increasing the likelihood of punch-through. Specifically, the present inventors have found that by growing the pad oxide layer 209 to a thickness of about 200 Angstroms at 900° C. in dry oxygen, a 0.4 V reduction in threshold voltage can be achieved for a 30 V device, without a substantial sacrifice in switching speed or punch-through resistance.

Figure 4F:
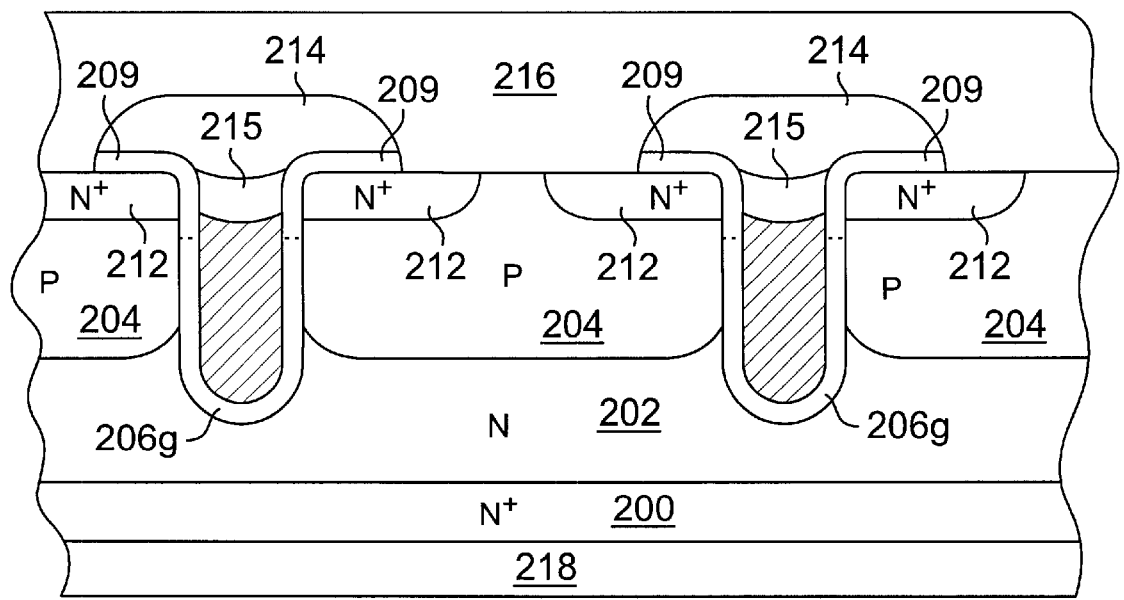

After source diffusion has occurred, the device of FIG. 4E is completed using conventional processing steps. For example, a BPSG (borophosphosilicate glass) layer can be formed over the entire structure, for example, by PECVD, and provided with patterned photoresist layer. The structure can then be etched, typically by reactive ion etching, removing the BPSG and oxide layers over at least a portion of each source region 212, while leaving behind regions of the BPSG layer 214, oxide layer 209 and oxide layer 215 over the polysilicon gate regions 210 (thus ensuring that the gate regions are insulated). The photoresist layer is then removed and the structure is provided with metal contact layer 216, which contacts the source regions 212. A metal contact 218 is also typically provided in connection with substrate 200. The resulting structure is shown in FIG. 4F.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A method of manufacturing one or more trench DMOS transistors comprising:
   providing a substrate of a first conductivity type, forming an epitaxial layer of said first conductivity type over said substrate, said epitaxial layer having a lower majority carrier concentration than said substrate;
   forming a region of a second conductivity type within an upper portion of said epitaxial layer;
   forming A plurality of trenches within said epitaxial layer, said trenches defining one or more body regions within said region of second conductivity type, forming a first insulating layer that lines said trenches;
   providing a conductive region within said trenches adjacent to the first insulating layer lining said trenches;
   removing a portion of said first insulating layer along at least upper sidewalls of said trenches such that portions of said body regions are exposed along said upper sidewalls;
   oxidizing at least said exposed portions of said body regions to form an oxide layer, said oxidizing step resulting in regions of reduced majority carrier concentration within said body regions adjacent said oxide layer; and
   forming a plurality of source regions of said first conductivity type within upper portions of said body regions adjacent said trenches, said source regions being adjacent said regions of reduced majority carrier concentration within said body regions.

2. The method of claim 1, wherein said substrate is a silicon substrate and said epitaxial layer is a silicon layer.

3. The method of claim 1, wherein the step of forming the region of second conductivity type includes implanting and diffusing a dopant into the epitaxial layer.

4. The method of claim 1, wherein the step of forming the trenches includes the step of forming a patterned masking layer over the epitaxial layer and etching said trenches through said masking layer.

5. The method of claim 1, wherein said first insulating layer is an oxide layer.

6. The method of claim 1, wherein the step of forming the first insulating layer comprises providing an oxide layer via dry oxidation.

7. The method of claim 1, wherein the step of removing a portion of the first insulating layer along at least upper sidewalls of the trenches is conducted via wet etch.

8. The method of claim 1, wherein the conductive region is a polycrystalline silicon region.

9. The method of claim 1, wherein the step of providing a conductive region within said trenches comprises depositing a layer of polycrystalline silicon and subsequently etching the polycrystalline silicon layer.

10. The method of claim 1, wherein the step of oxidizing at least the exposed upper sidewall portions of the body regions comprises dry oxidation at a temperature ranging from 900 to 1100° C.

11. The method of claim 10, wherein the temperature ranges from 900 to 950° C.

12. The method of claim 1, wherein the step of oxidizing at least the exposed upper sidewall portions of the body regions comprises oxidation in steam at a temperature ranging from 900 to 1100° C.

13. The method of claim 12, wherein the temperature ranges from 900 to 950° C.

14. The method of claim 1, wherein the step of forming the source regions includes the steps of forming a patterned masking layer and implanting and diffusing a dopant into the body regions.

15. The method of claim 1, wherein said first conductivity type is N-type conductivity and said second conductivity type is P-type conductivity.

16. The method of claim 1, wherein said body region is doped with boron.

17. A method of manufacturing one or more trench DMOS transistors comprising:

providing an N-type silicon substrate forming an N-type silicon epitaxial layer over said substrate, said epitaxial layer having a tower doping concentration than said substrate;

forming a P-type region within an upper portion of said epitaxal layer, fording a plurality of trenches within said epitaxial layer, said trenches defining one or more P-body regions within said P-type region;

foxing a first oxide layer that lines said trenches;

providing a conductive region within said trenches adjacent the first oxide layer lining said trenches;

removing a portion of said first oxide layer along at least upper sidewalls of said trenches such that portions of said P-body regions are exposed along said upper sidewalls;

oxidizing at least said exposed portions of said P-body regions to form a second oxide layer, said oxidizing step resulting in regions of reduced P-type carrier concentration within said P-body regions adjacent said second oxide layer; and forming a plurality of N-type source regions within upper portions of said P-body regions adjacent said trenches, said N-type source regions being adjacent said regions of reduced P-type carrier concentration within said P-body regions.

18. The method of claim 17, wherein the conductive region is a polycrystalline silicon region.

19. The method of claim 17, wherein the step of oxidizing at least the exposed upper sidewall portions of the P-body regions comprises dry oxidation at a temperature ranging from 900 to 1100° C.

20. The method of claim 19, wherein the temperature ranges from 900 to 950° C.

21. The method of claim 17, wherein the step of oxidizing at least the exposed upper sidewall portions of the P-body regions comprises wet oxidation in steam at a temperature ranging from 900 to 1100° C.

22. The method of claim 21, wherein the temperature ranges from 900 to 950° C.

23. The method of claim 17, wherein said P-body regions are doped with boron.

24. A Tnethod of modifying the majority carrier concentration in a body region within a trench D)MOS transistor comprising:

providing one or mote or more body regions adjacent one or more trenches, said one or more trenches being lined with a first insulating layer;

removing a portion of said first insulating layer along at least upper sidewalls of said trenches such that portions of said body regions are exposed along said upper sidewalls; and oxidizing at least said exposed portions of said body regions, said oxidizing step resulting in regions of reduced majority carrier concentration within said body regions adjacent said oxide layer.

* * * * *

UNITED STATES PATENT AND TRADEMARK OFFICE
CERTIFICATE OF CORRECTION

PATENT NO.   : 6,376,315 B1
DATED        : April 23, 2002
INVENTOR(S)  : Fwu-Iuan Hshieh et al.

It is certified that error appears in the above-identified patent and that said Letters Patent is hereby corrected as shown below:

<u>Title page,</u>
Item [57], ABSTRACT,
Line 2, after "more" (first occurrence), delete "or more".

<u>Column 2,</u>
Line 25, before "punch-through", insert -- of --.

<u>Column 9,</u>
Line 22, change "fording" to -- forming --.
Line 25, change "foxing" to -- forming --.

<u>Column 10,</u>
Line 21, change "Tnethod" to -- method --.
Line 22, change "D)MOS" to -- DMOS --.
Line 24, after "one" (first occurrence), delete -- or mote --.

Signed and Sealed this

Thirty-first Day of December, 2002

JAMES E. ROGAN
*Director of the United States Patent and Trademark Office*